(12) United States Patent
Koval et al.

(10) Patent No.: US 10,297,325 B2
(45) Date of Patent: May 21, 2019

(54) METHODS AND APPARATUSES INCLUDING AN ASYMMETRIC ASSIST DEVICE

(71) Applicant: Micron Technology, Inc., Boise, ID (US)

(72) Inventors: Randy J. Koval, Boise, ID (US); Hiroyuki Sanda, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/863,324

(22) Filed: Jan. 5, 2018

(65) Prior Publication Data

US 2018/0130536 A1    May 10, 2018

Related U.S. Application Data

(63) Continuation of application No. 14/171,426, filed on Feb. 3, 2014, now Pat. No. 9,875,801.

(51) Int. Cl.
*G11C 16/04* (2006.01)
*G11C 16/24* (2006.01)
*G11C 7/12* (2006.01)

(52) U.S. Cl.
CPC .......... *G11C 16/24* (2013.01); *G11C 16/0483* (2013.01); *G11C 7/12* (2013.01)

(58) Field of Classification Search
CPC ............................ G11C 16/0483; G11C 16/24
See application file for complete search history.

(56) References Cited

U.S. PATENT DOCUMENTS

| 5,812,454 A * | 9/1998 | Choi ................. G11C 16/0483 257/E27.103 |
| 6,028,788 A * | 2/2000 | Choi ................. G11C 16/0483 365/185.11 |
| 2006/0250850 A1 | 11/2006 | Lee |
| 2007/0047301 A1 | 3/2007 | Aritome |
| 2007/0047312 A1 | 3/2007 | Aritome |
| 2007/0258276 A1 | 11/2007 | Higashitani |
| 2009/0027967 A1* | 1/2009 | Lee ..................... G11C 16/0483 365/185.15 |
| 2010/0214839 A1 | 8/2010 | Guzzi et al. |
| 2011/0194357 A1* | 8/2011 | Han ....................... G11C 16/16 365/185.29 |
| 2011/0216603 A1 | 9/2011 | Han et al. |
| 2013/0092994 A1* | 4/2013 | Shim ................ G11C 16/0466 257/314 |
| 2013/0114345 A1* | 5/2013 | Lee ..................... G11C 16/0483 365/185.22 |
| 2014/0112074 A1 | 4/2014 | Rhie |
| 2015/0221347 A1 | 8/2015 | Koval et al. |

* cited by examiner

*Primary Examiner* — Huan Hoang
*Assistant Examiner* — Jay W. Radke
(74) *Attorney, Agent, or Firm* — Schwegman Lundberg & Woessner, P.A.

(57) ABSTRACT

Apparatuses and methods have been disclosed. One such apparatus includes a plurality of memory cells that can be formed at least partially surrounding a semiconductor pillar. A select device can be coupled to one end of the plurality of memory cells and at least partially surround the pillar. An asymmetric assist device can be coupled between the select device and one of a source connection or a drain connection. The asymmetric assist device can have a portion that at least partially surrounds the pillar and another portion that at least partially surrounds the source or drain connection.

20 Claims, 8 Drawing Sheets

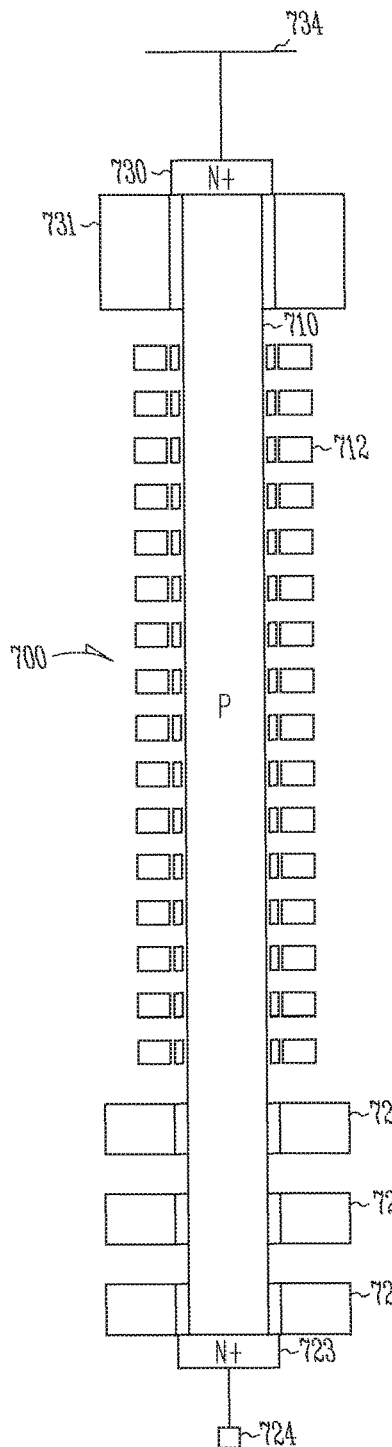
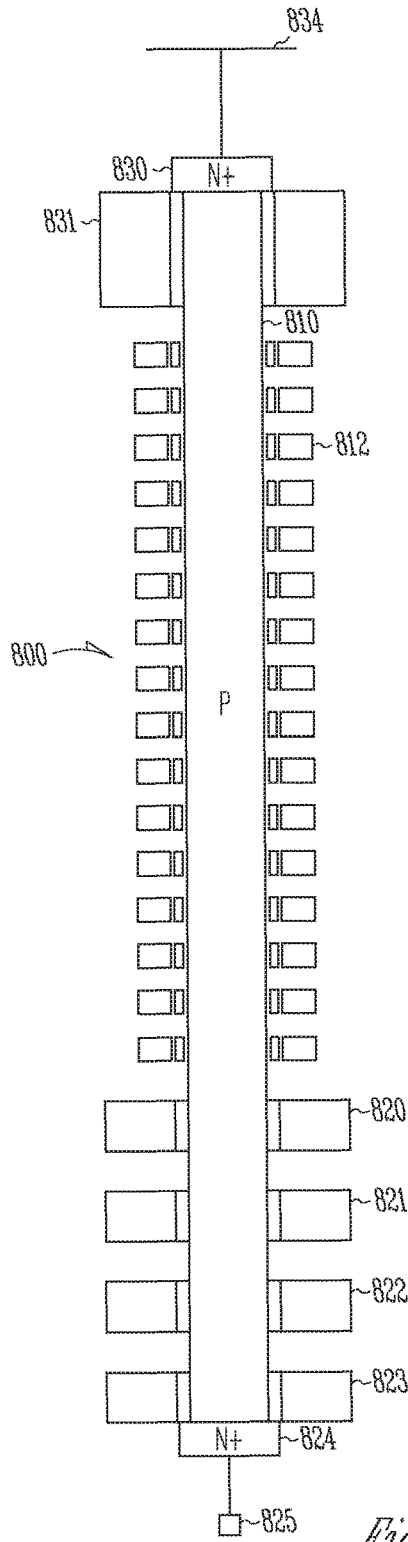
Fig. 7
Fig. 8

METHODS AND APPARATUSES INCLUDING AN ASYMMETRIC ASSIST DEVICE

PRIORITY APPLICATION

This application is a continuation of U.S. application Ser. No. 14/171,426, filed Feb. 3, 2014, which is incorporated herein by reference in its entirety.

BACKGROUND

Memory devices are typically provided as internal, semiconductor, integrated circuits in apparatuses such as computers or other electronic devices. There are many different types of memory including random-access memory (RAM), read only memory (ROM), dynamic random access memory (DRAM), synchronous dynamic random access memory (SDRAM), and non-volatile (e.g., flash) memory.

In a continuing process of forming ever increasing number of memory cells on an integrated circuit, memory manufacturers have begun fabrication of three-dimensional (3D) memory formed using semiconductor pillars. Some 3D vertical memory architectures include polysilicon channels that can introduce several deleterious effects relative to a planar memory equivalent.

For example, bulk traps/defects in the polysilicon channel of vertical memory architectures can give rise to relatively large reverse-biased junction leakage and gate-induced drain leakage (GIDL) currents. The same junctions in the vertical memory architecture typically provide low reverse biased off-state leakage under some bias conditions. These junctions can also act as current supplies to provide high junction leakage for other array operations that use similar bias conditions. This conflicting requirement can result in limiting the operating margin memory array operations (e.g. erase, program, read).

Thus, there are conflicting specifications for vertical memory architecture that can impose a series of fundamental engineering trade-offs. There are general needs to improve operating margins while reducing GIDL current.

BRIEF DESCRIPTION OF THE DRAWINGS

FIG. 7 illustrates a cross-sectional view of an embodiment of a semiconductor construction of a string of memory cells incorporating a plurality of source select devices and a source assist device.

FIG. 8 illustrates a cross-sectional view of an embodiment of a semiconductor construction of a string of memory cells incorporating a plurality of source select devices and a plurality of source assist devices.

DETAILED DESCRIPTION

The following disclosure refers to NAND non-volatile memory for the purposes of illustration only. The present disclosure is not limited to any one type of memory. For example, the memory might include non-volatile memory (e.g., NAND Flash, NOR Flash, phase change memory (PCM)) or volatile memory (e.g., DRAM, SRAM).

The following embodiments show strings of memory cells having 16 memory cells. This is for purposes of illustration only as the embodiments are not limited to any particular quantity of memory cells. Similarly, the following embodiments show only a single memory cell pillar for purposes of illustration only. The embodiments are not limited to any particular quantity of memory cell pillars.

Figure 1:
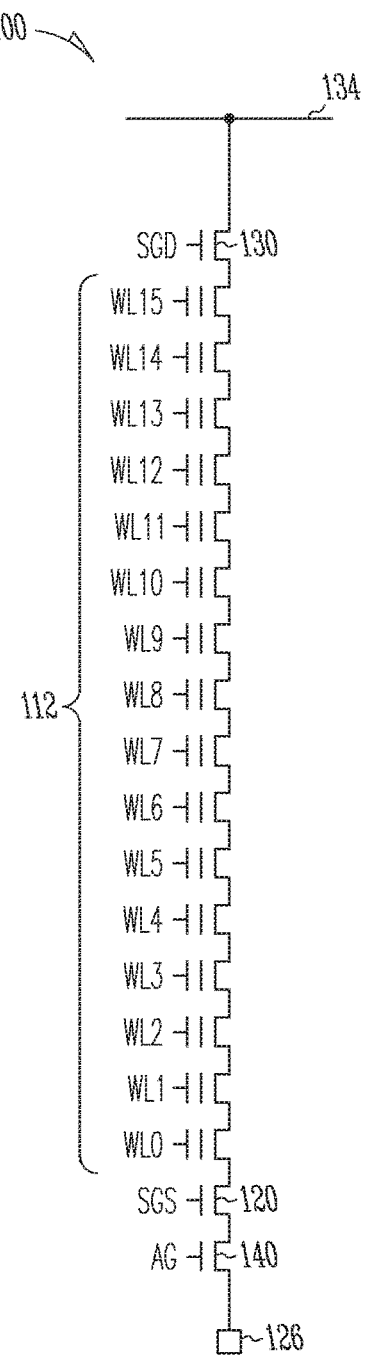
FIG. 1 illustrates a schematic diagram of an embodiment of a string of memory cells incorporating a source assist device.

FIG. 1 illustrates a schematic diagram of an embodiment of a string of memory cells 100 that can incorporate a source assist device 140 (e.g., vertical assist device, assist gate, transistor, etc.). The string of memory cells 100 can be one of multiple strings of memory cells in a block of memory cells in a memory device, such as a NAND memory device.

The string of memory cells 100 can include a source select device 120 (e.g., source select gate transistor) in series with the source assist device 140. Both the source select device 120 and the source assist device 140 may be n-channel transistors coupled between a memory cell 112 at one end of the string of memory cells 100 and a common source 126. As discussed subsequently with reference to FIG. 2, the source assist device 140 can be an asymmetric transistor.

The common source 126 may comprise, for example, a layer of commonly doped semiconductor material and/or other conductive material. The common source 126 can be coupled to a reference voltage $V_{ss}$ (e.g., ground) or a voltage source (e.g., a charge pump circuit not shown).

At the other end of the string of memory cells 100, a drain select device 130 (e.g., drain select gate transistor) may be an n-channel transistor coupled between one of the memory cells 112 and a data line (e.g., bit line) 134. The data line 134 can eventually be coupled to sense circuitry (not shown) for sensing (e.g., reading) a state of a selected memory cell 112.

Each memory cell 112 may comprise, for example, a floating gate transistor or a charge trap transistor. Each memory cell 112 can be a single level cell (SLC) for storing two bits of data or a multiple level cell (MLC) for storing two or more bits of data.

The memory cells 112, the source select device 120, the source assist device 14 and the drain select device 130 can be controlled by signals on their respective control gates. The signals on the control gates of the memory cells 112 can be provided on access lines (e.g., word lines) WL0-WL15. In an embodiment, the control gates of memory cells in a row of memory cells can at least partially form an access line.

The source select device 120 and the source assist device 140 can receive control signals to substantially control conduction between the string of memory cells 100 and the common source 126. The drain select device 130 can receive a control signal that controls the drain select device 130 so that the drain select device 130 can be used to select or deselect the string 100.

Figure 2:
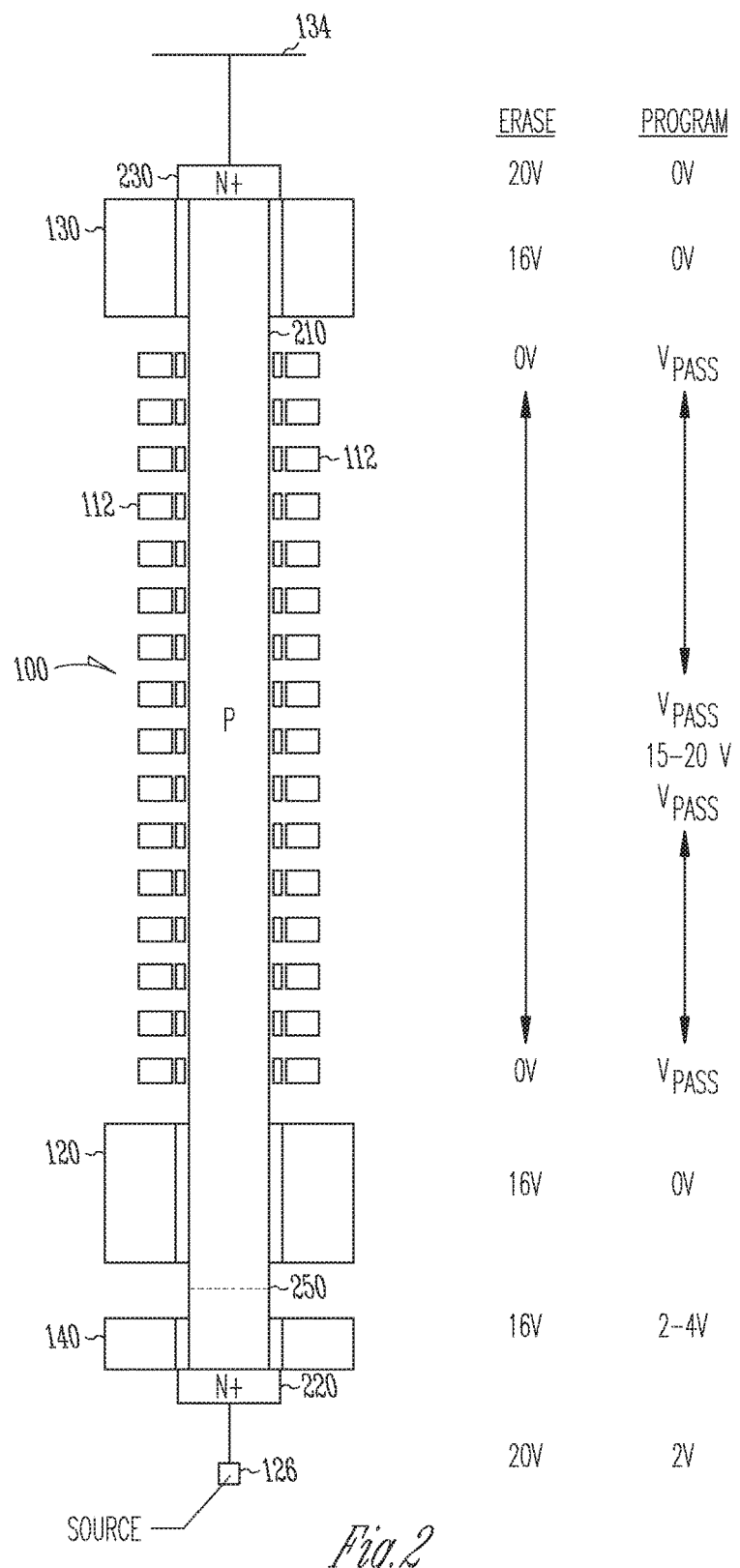
FIG. 2 illustrates a cross-sectional view of an embodiment of a semiconductor construction of the string of memory cells in accordance with the embodiment of FIG. 1.

FIG. 2 illustrates a cross-sectional view f an embodiment of a semiconductor pillar of the string of memory cells 100 of FIG. 1 that can extend from a substrate (not shown). Portions (e.g., gates) of the memory cells 112, source select device 120, source assist device 140, and the drain select device 130 can at least partially surround (e.g., surround or partially surround) a semiconductor material 210. The semiconductor material 210, in one embodiment, can comprise a pillar of p-type polysilicon and can operate as a channel for the memory cells 112, the source select device 120, the assist device 140, and the drain select device 130. The memory cells 112, the source select device 120, the assist device 140, and the drain select device 130 can thus be associated with the pillar of semiconductor material 210.

The pillar of semiconductor material 210 can extend between a source cap 220 (e.g., n+ type polysilicon) and a drain cap 230 (e.g., n+ type polysilicon). The source cap 220 can be in electrical contact with the pillar of semiconductor material 210 and can form a doped (e.g., p-n) junction with the semiconductor material 210. The drain cap 230 can be in electrical contact with the pillar of semiconductor material 210 and can form a doped (e.g., p-n) junction with the semiconductor material 210. A doped junction can also be an n+/n− junction. The source cap 220 can be a source connection for the pillar of semiconductor material 210 and the drain cap 230 can be a drain connection for the pillar of semiconductor material 210. The source cap 220 can be coupled to the common source 126. The drain cap 230 can be coupled to the data line 134.

The source assist device 140 can be an asymmetric vertical transistor. For example, a gate of the source assist device 140 can at least partially surround the semiconductor material 210 and also at least partially surround the source cap 220. Thus, the source assist device 140 may have one doped junction and one undoped junction (e.g., instead of two doped junctions or two un-doped junctions as found in a symmetric transistor, such as source select device 120). In the embodiment illustrated in FIG. 2, the drain select device 130 is also shown as an asymmetric vertical transistor. The source assist device 140 can be separated from the source select device 120 by a virtual (e.g., undoped) junction 250. The source assist device 140 can be used in one or more bias methods that can improve on/off margins for vertical memory operations, as described subsequently.

As used herein, a virtual junction may be defined as an undoped source/drain region 250 between the gates of the transistors that is formed by inversion charge via gate bias during operation (as opposed to substitutional doping introduced during manufacture as in a conventional transistor). For example, the source assist device 140 and the source select device 120 both share the same channel (the material can be p-type but it semiconductor material (e.g., p-type, n-type, undoped). The channel can be a solid material completely filling the entire volume or can be a thin film forming a "hollow" channel. During an erase operation, when maximum junction leakage is desired, the gates of both source select device 120 and the source assist device 140 can be biased together (e.g., concurrently), such as to leverage the doped junction for leakage generation. For example, FIG. 2 illustrates one embodiment for voltages for biasing (e.g., applying voltages to) gates of the string 100 during an erase operation using the source assist device 140.

It can be seen that, during the erase operation, the source 126 can be biased at a relatively high voltage (e.g., 20V) while the gates of the source select device 120 and the source assist device 140 can be biased together at an enable voltage (e.g., 16V). The control gates of the memory cells 112 can be biased at a reference voltage (e.g., 0V) while the gate of the drain select device 130 can be biased at the enable voltage (e.g., 16V) These voltages are for purposes of illustration only. The present embodiments are not limited to any particular voltages.

During a program operation, when it is desired to minimize junction leakage, the gate of the source assist device of a deselected string can be biased at the source 126 bias in order to minimize the off-state leakage on the deselected memory blocks. This can provide an increased operating window on the deselected memory blocks while preserving the isolation capability of the de-biased source select gate 120. For example, FIG. 2 illustrates one embodiment of voltages for biasing gates of a deselected string 100 during a. program operation using the source assist device 140.

It can be seen that, during the program operation, the source 126 of the deselected string 100 can be biased at a relatively low voltage (e.g., 2V) while the gate of the source select device 120 of the deselected string 100 can be biased at a disable voltage (e.g., 0V) and the gate of the source assist device 140 of the deselected string 100 can be biased at approximately the same voltage as the source (e.g., 2-4V). The control gate of the memory cell selected to be programmed (and thus the control gate of a memory cell in the deselected string commonly coupled with that control gate) can be biased at a program voltage (e.g., increasing program pulses) in a range of 15-20V while the control gates of the other memory cells in the selected and deselected strings can be biased at a pass voltage $V_{pass}$. The gate of the drain select device 130 can be biased at a relatively low voltage (e.g., 0V), These voltages are for purposes of illustration only. The present embodiments are not limited to any particular voltages.

Figure 3:
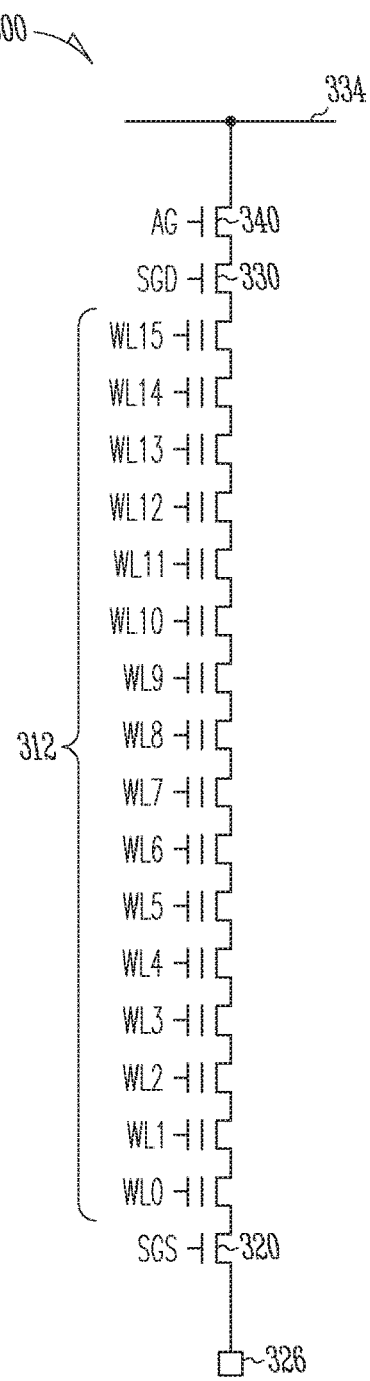
FIG. 3 illustrates a schematic diagram of an embodiment of a string of memory cells incorporating a drain assist device.

FIG. 3 illustrates a schematic diagram of an embodiment of a string of memory cells 300 that can incorporate a drain assist device 340 (e.g., vertical assist device, assist gate, transistor, etc.). The string 300 can be one of multiple strings of memory cells in a block of memory cells in a memory device, such as a NAND memory device.

The string of memory cells 300 can include a drain select device 330 in series with the drain assist device 340. Both the drain select device 330 and the drain assist device 340 may be n-channel transistors coupled between a memory cell 312 at one end of the string of memory cells 300 and a data line 334. The data line 334 can eventually be coupled to sense circuitry (not shown) for sensing a state of a selected memory cell 312. As discussed subsequently with reference to FIG. 4, the drain assist device 340 can be an asymmetric transistor.

At the other end of the string of memory cells 300, a source select device 320 may be an n-channel transistor coupled between one of the memory cells 312 and a common source 326. The common source 326 may comprise, for example, commonly doped semiconductor material and/or other conductive material. The common source 326 can be coupled to a reference voltage $V_{ss}$ (e.g., ground) or a voltage source (e.g., a charge pump circuit not shown).

Each memory cell 312 can comprise, for example, a floating gate transistor or a charge trap transistor. Each memory cell 312 can be a single level cell (SLC) for storing two bits of data or a multiple level cell (MLC) for storing two or more bits of data.

The memory cells 312, the drain select device 330, the drain assist device 340, and the source select device 320 can be controlled by signals on their respective control gates. The signals on the control gates of the memory cells 312 can be provided on access lines WL0-WL15. In an embodiment, the control gates of memory cells in a row of memory cells can at least partially form an access line.

The drain select device 330 and the drain assist device 340 can receive a control signal that controls the drain select device 330 and the drain assist device 340 so that the drain select device 330 and the drain assist device 340 can be used to select or deselect the string 300. The source select device 320 can receive control signals to substantially control conduction between the string of memory cells 300 and the common source 326.

Figure 4:
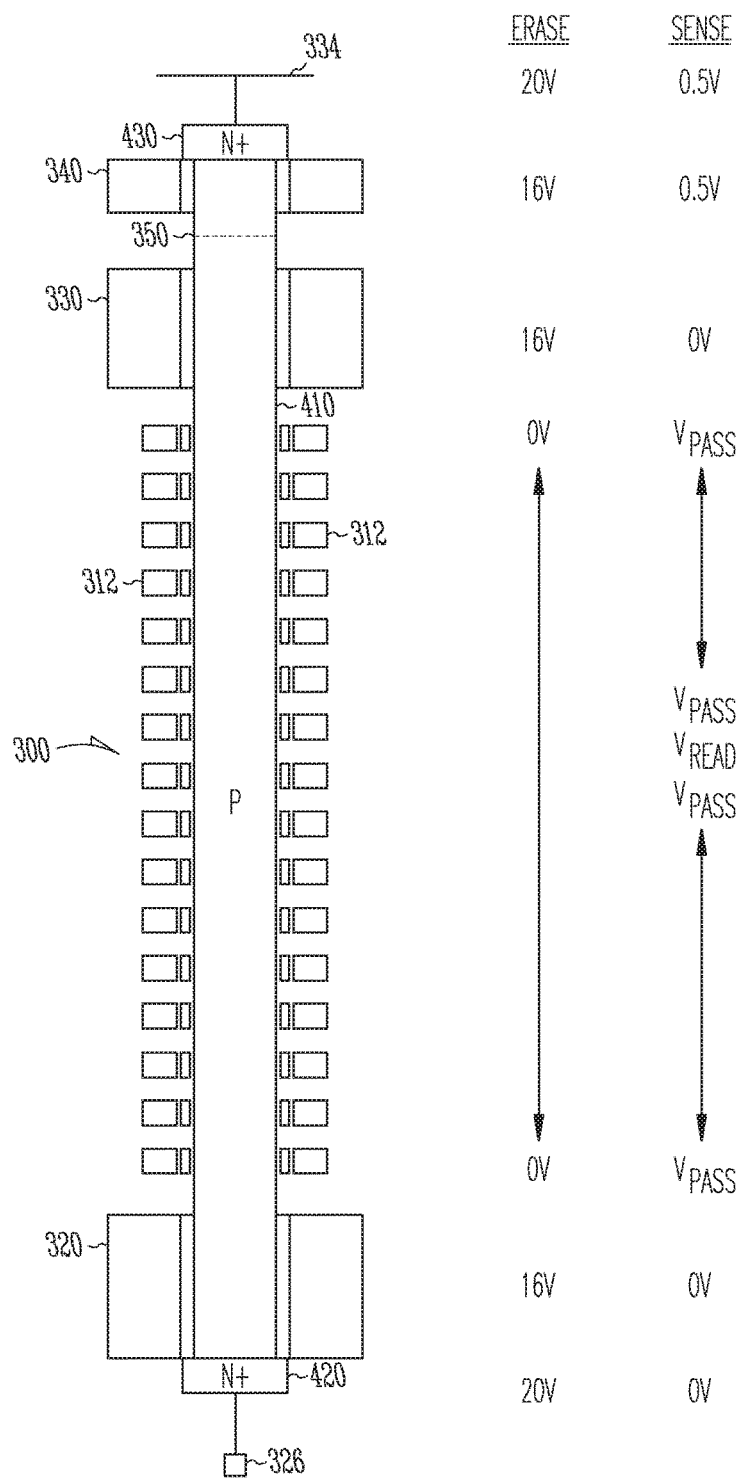
FIG. 4 illustrates a cross-sectional view of an embodiment of a semiconductor construction of the string of memory cells in accordance with the embodiment of FIG. 3.

FIG. 4 illustrates a cross-sectional view of an embodiment of a semiconductor pillar of the string of memory cells 300 of FIG. 3 that can extend from a substrate (not shown). Portions (e.g., gates) of the memory cells 312, source select device 320, the drain select device 330, and drain assist device 340 can at least partially surround (e.g., surround or partially surround) a semiconductor material 410. The semiconductor material 410, in one embodiment, can comprise a pillar of doped or undoped polysilicon and can be used as a channel for the memory cells 312, the source select device 320, the drain select device 330, and the drain assist device 340. The memory cells 312, the source select device 320, the drain select device 330, and the drain assist device 340 can thus be associated with the pillar of semiconductor material 410.

The pillar of semiconductor material 410 can extend between a source cap 420 (e.g., n+ type polysilicon) and a drain cap 430 (e.g., n+ type polysilicon). The source cap 420 can be in electrical contact with the pillar of semiconductor material 410 and can form a doped (e.g., p-n) junction with the semiconductor material 410. The drain cap 430 can be in electrical contact with the pillar of semiconductor material 410 and can form a doped (e.g., p-n) junction with the semiconductor material 410. The source cap 420 can be a source for the pillar of semiconductor material 410 and the drain cap 430 can be a drain for the pillar of semiconductor material 410. The source cap 420 can be coupled to the common source 326. The drain cap 430 can be coupled to the data line 334.

The drain assist device 340 can be an asymmetric vertical transistor. For example, a gate of the drain assist device 340 can at least partially surround the semiconductor material 410 and also at least partially surround the drain cap 430. Thus, the drain assist device 340 can have one doped junction and one undoped junction (e.g., instead of two undoped junctions, such as found in the drain select device 330). In the embodiment illustrated in FIG. 4, the source select device 320 is also shown as an asymmetric vertical transistor. The device that connects to the data line or source line are asymmetric whether it is on the source or drain side, normal select device or assist device. In the embodiment of FIG. 3, SGD 330 in is a symmetric device where both junctions are undoped in this configuration. SGS 320 is asymmetric since the side that connects to 326 has a doped junction while the other side of the device does not.

). The drain assist device 340 can be separated from the drain select device 330 by a virtual junction 350. The drain assist device 340 can be used in one or more bias methods that can improve on/off margins for vertical memory operations, as described subsequently.

During an erase operation, the gates of both drain select device 330 and the drain assist device 340 can be biased together in order to maintain an operating margin for erase condition. For example, FIG. 4 illustrates one embodiment for bias voltages for biasing gates of the string 300 during an erase operation using the drain assist device 340.

It can be seen that, during the erase operation, the data line 334 can be biased at an erase voltage (e.g., approximately 20V) while the gates of the drain select device 330 and the drain assist device 340 can be biased at an enable voltage that is slightly less than the erase voltage (e.g., 16V). The control gates of the memory cells 312 can be biased at a reference voltage (e.g., 0V) while the gate of the source select device 320 can be biased at the relatively high enable voltage (e.g., 16V). These voltages are for purposes of illustration only. The present embodiments are not limited to any particular voltages.

During a sense operation, the gate of the drain assist device 340 of a deselected string can be biased at the data line 334 bias, such as to minimize the off-state leakage on the deselected memory blocks thus increasing the operating window. Proper biasing of the drain assist device 340 can shift the point of the junction leakage to a virtual (e.g., undoped) junction 350 of a pillar 410 associated with the string of memory cells 100. This can minimize the off-state leakage and improve sensing margins. For example, FIG. 4 illustrates one embodiment for voltages for biasing gates of the string 300 during a sense operation using the drain assist device 340.

It can be seen that, during the sense operation, the data line 334 can be biased at a relatively low voltage that can be less than 1V (e.g., 0.5V) while the gate of the drain select device 330 of a deselected string 300 can be biased at a disable voltage (e.g., 0V) and the gate of the drain assist device 340 can be biased at the same voltage as the data line (e.g., 0.5V). The control gate of the selected memory cell to be read (and, thus, the control gate of an unselected memory cell in the deselected string 300 that is commonly coupled to the control gate of the selected memory cell) can be biased at a sense voltage (e.g., 5V) while the control gates of the other memory cells in the string 300 (i.e., memory cells in the deselected string 300 having control gates coupled to control gates of unselected memory cells in the selected string) can be biased at a pass voltage $V_{pass}$ (e.g., 10V). These voltages are for purposes of illustration only. The present embodiments are not limited to any particular voltages.

Figure 5:
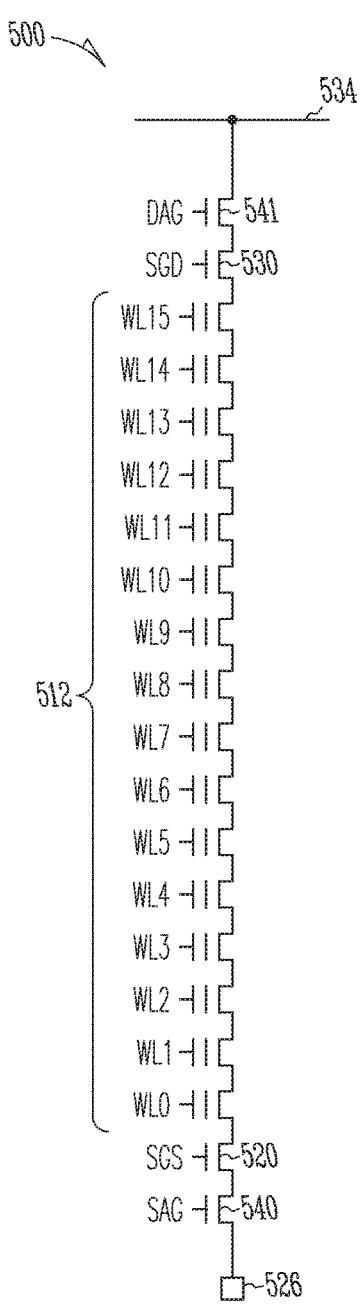
FIG. 5 illustrates a schematic diagram of an embodiment of a string of memory cells incorporating a drain assist device and a source assist device.

FIG. 5 illustrates a schematic diagram of an embodiment of a string of memory cells 500 that can incorporate a drain assist device 541 (e.g., drain assist gate) and a source assist device 540 (e.g., source assist gate). The string 500 can be one of multiple strings of memory cells in a block of memory cells in a memory device, such as a NAND memory device.

The string of memory cells 500 can include a drain select device 530 in series with the drain assist device 541. Both the drain select device 530 and the drain assist device 541 may be n-channel transistors coupled between a memory cell 512 at one end of the string of memory cells 500 and a data line 534. The data line 534 can eventually be coupled to sense circuitry (not shown) for sensing a state of a selected memory cell 512. As discussed subsequently with reference to FIG. 6, the drain assist device 541 can be an asymmetric transistor.

The string of memory cells 500 can include a source select device 520 in series with the source assist device 540. Both the source select device 520 and the source assist device 540 may be n-channel transistors coupled between a memory cell 512 at one end of the string of memory cells 500 and a common source 526. As discussed subsequently with reference to FIG. 6, the source assist device 540 can be an asymmetric transistor.

The common source 526 may comprise, for example, commonly doped semiconductor material and/or other conductive material. The common source 526 can be coupled to a reference voltage $V_{ss}$ (e.g., ground) or a voltage source (e.g., a charge pump circuit not shown).

Each memory cell 512 can comprise, for example, a floating gate transistor or a charge trap transistor. Each memory cell 512 can be a single level cell (SLC) for storing two bits of data or a multiple level cell (MLC) for storing two or more bits of data.

The memory cells 512, the drain select device 530, the drain assist device 541, the source select device 520, and the source assist device 540 can be controlled by signals on their respective control gates. The signals on the control gates of the memory cells 312 can be provided on access lines WL0-WL15. In an embodiment, the control gates of memory cells in a row of memory cells can at least partially form an access line.

The drain select device 530 and the drain assist device 541 can receive a control signal that controls the drain select device 530 and the drain assist device 541 so that the drain select device 530 and the drain assist device 541 can be used to select or deselect the string 500. The source select device 520 and the source assist gate 540 can receive control signals to substantially control conduction between the string of memory cells 500 and the common source 526.

Figure 6:
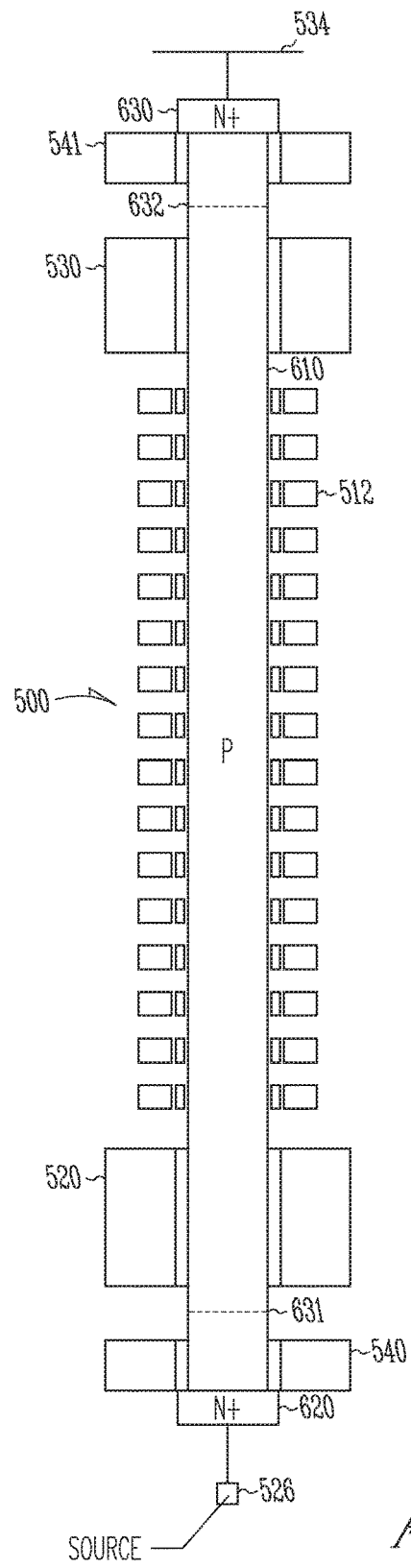
FIG. 6 illustrates a cross-sectional view of an embodiment of a semiconductor construction of the string of memory cells in accordance with the embodiment of FIG. 5.

FIG. 6 illustrates a cross-sectional view of an embodiment of a semiconductor pillar of the string of memory cells 500 of FIG. 5 that can extend from a substrate (not shown). Portions (e.g., gates) of the memory cells 512, source select device 520, the drain select device 530, drain assist device 541, and source assist device 540 can at least partially surround (e.g., surround or partially surround) a semiconductor material 610. The semiconductor material 610, in one embodiment, can comprise a pillar of p-type polysilicon and can be used as a channel for the memory cells 512, the source select device 520, the drain select device 530, the drain assist device 541, and the source assist device 540. The memory cells 512, the source select device 520, the drain select device 530, the drain assist device 541, and the source assist device 540 can thus be associated with the pillar of semiconductor material 610.

The pillar of semiconductor material 610 can extend between a source cap 620 (e.g., n+ type polysilicon) and a drain cap 630 (e.g., n+ type polysilicon). The source cap 620 can be in electrical contact with the pillar of semiconductor material 610 and can form a doped (e.g., p-n) junction with the semiconductor material 610. The drain cap 630 can be in electrical contact with the pillar of semiconductor material 610 and can form a doped (e.g., p-n) junction with the semiconductor material 610. The source cap 620 can be a source for the pillar of semiconductor material 610 and the drain cap 630 can be a drain for the pillar of semiconductor material 610. The source cap 620 can be coupled to the common source 526. The drain cap 630 can be coupled to the data line 534.

The drain assist device 541 and the source assist device 540 can be asymmetric vertical transistors. For example, gates of the drain assist device 541 and the source assist device 540 can at least partially surround the semiconductor material 610 and also at least partially surround their respective caps 630, 620. Thus, the drain assist device 541 and the source assist device 540 can each have one doped junction and one undoped junction (instead of two undoped junctions, as found in each of the drain and source select devices 530, 520). The source and drain assist devices 540, 541 can be separated from their respective select devices 520, 530 by a respective virtual junction 631, 632. The drain assist device 541 and the source assist device 540 can be used in one or more bias methods that can improve on/off margins for vertical memory operations.

The biasing of the gates of the drain assist device 541 and the source assist device 540 during memory operations are shown previously with reference to FIGS. 2 and 4. For example, during an erase operation the gate of the source assist device 540 can be biased at approximately 16V while the gate of the drain assist device 541 can be biased at approximately 16V. During a sense operation, the gate of the source assist device 540 of a deselected string 500 can be biased at some voltage that is less than 1V (e.g., 0.5V) while the gate of the drain assist device of the deselected string 500 can be biased at approximately the same voltage (e.g., 0.5V). During a program operation, the gate of the source assist device 540 of a deselected string 500 can be biased at approximately 2-4V while the gate of the drain assist device 541 of the deselected string 500 can be biased at approximately 2-4V. As in all previous embodiments, these voltages are for purposes of illustration only as the embodiments are not limited to any one particular voltage.

FIG. 7 illustrates a cross-sectional view of another embodiment of a semiconductor pillar of a string of memory cells 700 that can extend from a substrate (not shown). This embodiment can include multiple source select devices 720, 721 and a source assist device 722. Portions (e.g., gates) of the memory cells 712, the source select devices 720, 721, the drain select device 731, and the source assist device 722 can at least partially surround (e.g., surround or partially surround) a semiconductor material 710. The semiconductor material 710, in an embodiment, can comprise a pillar of p-type polysilicon and can be used as a channel for the memory cells 712, the source select devices 720, 721, the drain select device 731, and the source assist device 722. The memory cells 712, the source select devices 720, 721, the drain select device 731, and the source assist device 722 can thus be associated with the pillar of semiconductor material 710.

The pillar of semiconductor material 710 can extend between a source cap 723 (e.g., n+ type polysilicon) and a drain cap 730 (e.g., n+ type polysilicon). The source cap 723 can be in electrical contact with the pillar of semiconductor material 710 and can form a doped (e.g., p-n junction) with the semiconductor material 710. The drain cap 730 can be in electrical contact with the pillar of semiconductor material 710 and can form a doped (e.g., p-n) junction with the semiconductor material 710. The source cap 723 can be a source for the pillar of semiconductor material 710 and the drain cap 730 can be a drain for the pillar of semiconductor material 710. The source cap 723 can be coupled to the common source 724. The drain cap 730 can be coupled to the data line 734.

The source assist device 722 can be an asymmetric vertical transistor. For example, a gate of the source assist device 722 can at least partially surround the semiconductor material 710 and also at least partially surround the source junction 723. Thus, the asymmetric source assist device 722 can have one doped junction and one undoped junction (e.g., instead of two undoped/virtual junctions, as found in the symmetric source select devices 720, 721). In the embodiment illustrated in FIG. 7, the drain select device 731 is also shown as an asymmetric vertical transistor. The biasing of the gates of the source select devices 720, 721, the source assist device 722, the drain select device 731 and the control gates of the memory cells during memory operations were shown and discussed previously.

FIG. 8 illustrates a cross-sectional view of another embodiment of a semiconductor pillar of a string of memory cells 800 that can extend from a substrate (not shown). This embodiment can include multiple source select devices 820, 821 and multiple source assist devices 822, 823. Portions (e.g., gates) of the memory cells 812, the source select devices 820, 821, the drain select device 831, and the source assist devices 822, 823 can at least partially surround (e.g., surround or partially surround) a semiconductor material 810. The semiconductor material 810, in an embodiment, can comprise a pillar of p-type polysilicon and can be used as a channel for the memory cells 812, the source select devices 820, 821, the drain select device 831, and the source assist devices 822, 823. The memory cells 812, the source select devices 820, 821, the drain select device 831, and the source assist devices 822, 823 can thus be associated with the pillar of semiconductor material 810.

The pillar of semiconductor material 810 can extend between a source cap 824 (e.g., n+ type polysilicon) and a drain cap 830 (e.g., n+ type polysilicon). The source cap 824 can be in electrical contact with the pillar of semiconductor material 810 and can form a doped (e.g., p-n) junction with the semiconductor material 810. The drain cap 830 can be in electrical contact with the pillar of semiconductor material 810 and can form a doped (e.g., p-n) junction with the semiconductor material 810. The source cap 824 can be a source for the pillar of semiconductor material 810 and the drain cap 830 can be a drain for the pillar of semiconductor material 810. The source cap 824 can be coupled to the common source 825. The drain cap 830 can be coupled to the data line 834.

One of the source assist devices 823 can be an asymmetric vertical transistor while the other source assist device 822 can be a symmetric vertical transistor. For example, a gate of the asymmetric source assist device 823 can at least partially surround the semiconductor material 810 and also at least partially surround the source cap 824. Thus, the asymmetric source assist device 823 can have one doped junction and one undoped junction (e.g., instead of two undoped junctions, as found in each of the source select devices 820,821 and the other source assist device 822). In the embodiment illustrated in FIG. 8, the drain select device 831 is also shown as an asymmetric vertical transistor. The biasing of the gates of the source select devices 820, 821, the source assist devices 822, 823, the drain select device 831 and the control gates of the memory cells during memory operations were shown and discussed previously.

In the embodiments of FIGS. 7 and 8, the use of multiple select devices may ease process integration for some architectures such that current memory operations can operate with the disclosed embodiments with minimal changes. One device can be designated as an assist device while the gate of the other devices can be biased together as disclosed in the embodiments of FIGS. 2 and/or 4. The designation of which of the devices are to be used as primary select devices and which are assist devices can be determined after manufacture and trimmed to null out variability. The assist device length can be set by a nominal junction depth and its variability introduced during the manufacturing process. The device size can be set by ensuring that a metallurgical junction resides between the edges of the polysilicon control gate.

While the embodiments of FIGS. 7 and 8 illustrate multiple source select devices and multiple select assist devices, other embodiments can employ multiple drain select devices with a single drain assist device, multiple drain select devices with multiple drain assist devices, or any combination of the above described embodiments.

Figure 9:
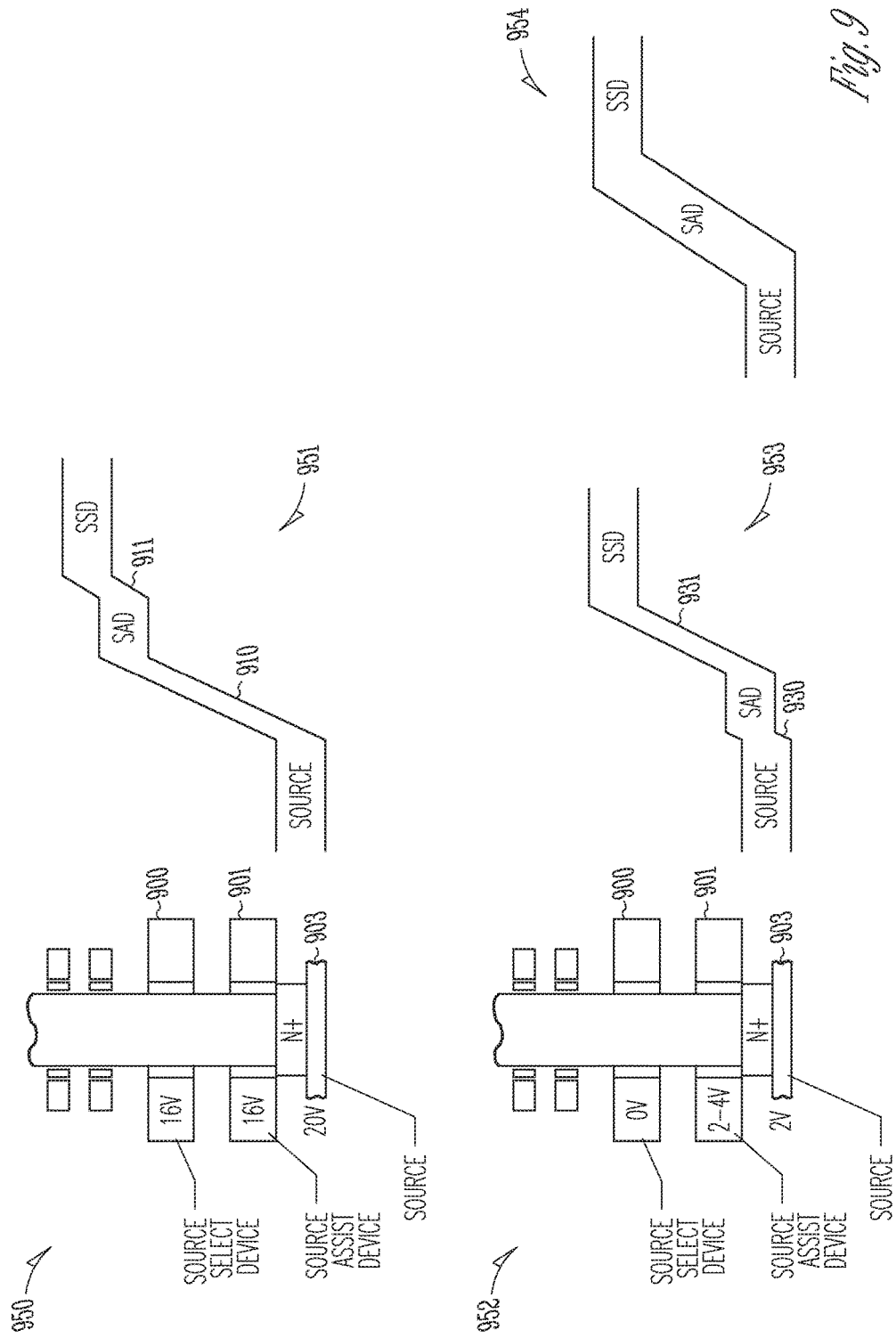
FIG. 9 illustrates diagrams of examples of junction voltage differences during memory operations in accordance with the embodiment of FIGS. 1 and 2.

FIG. 9 illustrates diagrams of examples of junction voltage differences during memory operations in accordance with the embodiment of FIGS. 1 and 2. FIG. 9 illustrates a portion 950, 952 of the pillar structure of FIG. 2. The top structure 950 is shown biased as in an erase operation while the bottom structure 952 is shown biased as in a program operation.

The junction voltage diagram 951 of the erase operation shows that, when high leakage is desired (e.g., erase operation), the gate of the source assist device 901 (SAD) can be biased substantially similarly to the gate of the select device 900 (SSD) (e.g., 16V) so that the larger voltage drop can be shifted from the virtual junction 911 to the doped junction 910 (e.g., the junction between the doped N+ source cap and the pillar material). The virtual junction 911, at the intersection of the select device and the assist device, can have a smaller voltage drop.

The junction voltage diagram 953 of the program operation shows that, when low leakage is desired (e.g., program operation), the gate of the assist device 901 of a deselected string can be biased to shift the larger voltage drop to the virtual junction 931. The junction 930 (e.g., the junction between the doped N+ source cap and the pillar material) can have a smaller voltage drop. A junction electric field diagram 954 for the program operation illustrates an embodiment of the select device/assist device junction being biased to minimize the maximum electric field.

The diagrams of FIG. 9 illustrate the junction voltage between source assist device and the source select device. The junction voltage shift between the drain assist device and the drain select device is substantially similar.

Figure 10:
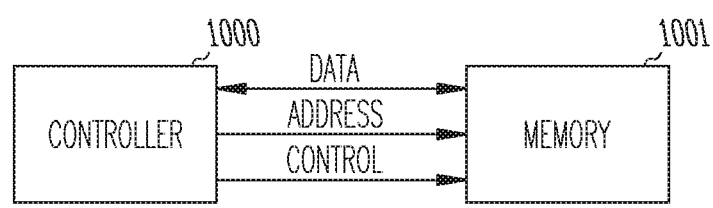
FIG. 10 illustrates a block diagram of an apparatus in accordance with the embodiments of FIGS. 1-8.

FIG. 10 illustrates a block diagram of an apparatus that may use the vertical assist devices of FIGS. 1-8. A controller 1000 may be used to control operations of the apparatus. A memory device 1001, coupled to the controller 1000, may include a memory array comprising memory cell strings with vertical assist devices as described above with reference to FIGS. 1-8.

In an embodiment, the controller 1000 may be coupled to the memory device 1001 over control, data, and address buses. In another embodiment, the address and data buses may share a common input/output (I/O) bus. The controller 1000 can be part of the same integrated circuit as the memory device 1001 or as separate integrated circuits.

As used herein, an apparatus may refer to, for example, circuitry, an integrated circuit die, a memory device, a memory array, or a system including such a circuit, die, device or array.

CONCLUSION

One or more embodiments of the vertical assist device can increase on/off margins when biased to shift the largest voltage drop from a doped junction between the source or drain and the pillar of semiconductor material to a virtual junction between the assist device and the select device during an operation that desires high leakage. During an operation that desires low leakage, the gate of an assist device can be biased to shift the largest voltage drop to the virtual junction between the assist device and the select device.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. An apparatus, comprising:
a string of memory cells;
a first select device coupled to the string of memory cells;
an assist device coupled between the first select device and a first source or drain connection; and
a controller configured to control the first select device and the assist device,
wherein the first select device comprises a symmetric device that shares an undoped junction with the string of memory cells and an undoped junction with the assist device,
wherein the assist device comprises an asymmetric device that shares an undoped junction with the first select device and a doped junction with the first source or drain connection, and
wherein the controller is configured to bias gates of the first select device and the assist device to a first voltage during an erase operation, and to bias the gates of the first select device and the assist device to different second and third voltages during a program operation.

2. The apparatus of claim 1,
wherein the first source or drain connection comprises a source connection, and
wherein the first select device comprises a source select gate transistor and the assist device comprises a source assist device coupled between the source connection and the source select gate transistor.

3. The apparatus of claim 1,
wherein the first select device comprises a drain select gate transistor,
wherein the first source or drain connection comprises a drain connection, and
wherein the assist device comprises a drain assist device coupled between the drain connection and the drain select gate transistor.

4. The apparatus of claim 3,
wherein the first select device is coupled to a first end of the string of memory cells, the apparatus further comprising:
a source select gate transistor coupled to a second end of the string of memory cells; and
a source assist device coupled between the source select gate transistor and a source connection.

5. The apparatus of claim 1, comprising:
a semiconductor pillar, wherein the assist device is separated from the first select device by a virtual junction,
wherein a portion of each memory cell of the string of memory cells at least partially surrounds a semiconductor pillar,
wherein the assist device comprises an asymmetric vertical transistor having one doped junction,
wherein a portion of the assist device at least partially surrounds both the semiconductor pillar and the first source or drain connection, and
wherein a portion of the first select device at least partially surrounds the semiconductor pillar.

6. The apparatus of claim 1,
wherein the first select device comprises a plurality of select devices coupled between the plurality of memory cells and the assist device, and
wherein the assist device comprises a plurality of assist devices, the plurality of assist devices comprising at least one asymmetric transistor.

7. The apparatus of claim 1, wherein the first voltage is higher than the second and third voltages, and the third voltage is higher than the second voltage.

8. The apparatus of claim 7, wherein the controller is configured to bias the gate of the first select device to the second voltage and the gate of the assist device to the third voltage during a program operation to reduce junction leakage in contrast to the junction leakage during the erase operation.

9. An apparatus, comprising:
a semiconductor pillar having a drain connection at one end and a source connection at an opposite end;
a string of memory cells, wherein a portion of each memory cell of the string of memory cells at least partially surrounds the pillar;
a symmetric select device coupled to an end of the string of memory cells, a portion of the select device at least partially surrounding the pillar;
an asymmetric assist device coupled between the select device and a first source or drain connection; and
a controller configured to control the symmetric select device and the asymmetric assist device;
wherein the symmetric select device shares an undoped junction with the string of memory cells and an undoped junction with the asymmetric assist device,
wherein the asymmetric assist device shares an undoped junction with the select device and a doped junction with the first source or drain connection, and
wherein the first source or drain connection is one of the drain connection or the source connection, and
wherein the controller is configured to bias gates of the symmetric select device and the asymmetric assist device to a first voltage during an erase operation, and to bias the gates of the symmetric select device and the asymmetric assist device to different second and third voltages during a program operation.

10. The apparatus of claim 9,
wherein the semiconductor pillar extends from a substrate.

11. The apparatus of claim 9,
wherein the semiconductor pillar is configured to operate as a channel for the string of memory cells, the select device, and the asymmetric assist device.

12. The apparatus of claim 9,
wherein the first source or drain connection comprises a source connection, and
wherein the symmetric select device comprises a source select gate transistor and the asymmetric assist device comprises a source assist device coupled between the source connection and the source select gate transistor.

13. The apparatus of claim 9,
wherein the first source or drain connection comprises a drain connection.

14. The apparatus of claim 9, wherein the first voltage is higher than the second and third voltages, and the third voltage is higher than the second voltage, and
wherein the controller is configured to bias the gate of the first select device to the second voltage and the gate of the assist device to the third voltage during a program operation to reduce junction leakage in Contrast toile junction leakage during the erase operation.

15. A method, comprising:
biasing gates of a symmetric select device and an asymmetric assist device coupled between the symmetric select device and a first source or drain connection coupled to a string of memory cells to a first voltage during an erase operation; and biasing the gates of the symmetric select device and the asymmetric assist device to different second and third voltages during a program operation, wherein the symmetric select device shares an undoped junction with the string of memory cells and an undoped junction with the asymmetric assist device, and wherein the asymmetric assist device shares an undoped junction with the select device and a doped junction with the first source or drain connection.

16. The method of claim 15, wherein biasing the gates of the symmetric select device and the asymmetric assist device to the first voltage shifts a voltage drop from a virtual junction to a junction between the asymmetric assist device and the first source or drain connection such that the virtual junction has a smaller voltage drop than the junction between the asymmetric assist device and the first source or drain connection.

17. The method of claim 15, wherein the first source or drain connection comprises a source connection, wherein the select device comprises a source select gate transistor, and wherein the asymmetric assist device comprises a source assist device coupled between the source connection and the source select gate transistor.

18. The method of claim 15, wherein the first source or drain connection comprises a drain connection.

19. The method of claim 15, wherein the asymmetric assist device comprises a first doped junction and a second undoped junction, and wherein the select device comprises first and second undoped junctions.

20. The method of claim 15, wherein the first voltage is higher than the second and third voltages, and the third voltage is higher than the second voltage, and wherein biasing the gates of the symmetric select device and the asymmetric assist device to different second and third voltages during a program operation comprises biasing the gate of the first select device to the second voltage and the gate of the assist device to the third voltage during a program operation to reduce junction leakage in contrast to the junction leakage during the erase operation.

* * * * *